(12) United States Patent
Im et al.

(10) Patent No.: US 9,628,258 B2
(45) Date of Patent: Apr. 18, 2017

(54) CLOCK GENERATION CIRCUIT AND METHOD AND SEMICONDUCTOR APPARATUS AND ELECTRONIC SYSTEM USING THE SAME

(71) Applicant: SK hynix Inc., Icheon-si, Gyeonggi-do (KR)

(72) Inventors: Da In Im, Icheon-si (KR); Young Suk Seo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/845,425

(22) Filed: Sep. 4, 2015

(65) Prior Publication Data

US 2017/0005782 A1 Jan. 5, 2017

(30) Foreign Application Priority Data

Jul. 3, 2015 (KR) ........................ 10-2015-0095306

(51) Int. Cl.
*H04L 7/033* (2006.01)
*H04L 7/00* (2006.01)
*H04L 7/04* (2006.01)

(52) U.S. Cl.
CPC ............ *H04L 7/0045* (2013.01); *H04L 7/048* (2013.01)

(58) Field of Classification Search
USPC .......................... 375/371, 376, 355; 327/237
See application file for complete search history.

(56) References Cited

U.S. PATENT DOCUMENTS

| 8,294,501 | B1 * | 10/2012 | Thomas | H03L 7/081 327/233 |
| 2005/0008111 | A1 * | 1/2005 | Suzuki | H03L 7/089 375/371 |
| 2006/0120496 | A1 * | 6/2006 | Okamura | H03L 7/07 375/355 |
| 2007/0223638 | A1 * | 9/2007 | Okamura | H03K 5/1504 375/376 |
| 2012/0223765 | A1 * | 9/2012 | Wang | G06F 1/3206 327/534 |
| 2016/0301519 | A1 * | 10/2016 | Sengoku | H04L 7/0045 |

FOREIGN PATENT DOCUMENTS

| KR | 100763849 B1 | 9/2007 |
| KR | 101212724 B1 | 12/2012 |

\* cited by examiner

*Primary Examiner* — Eva Puente
(74) *Attorney, Agent, or Firm* — William Park & Associates Ltd.

(57) ABSTRACT

A clock generation circuit may include a reference clock generator configured to generate a pair of first reference clocks in an offset code generation mode, a triggering unit configured to generate a pair of second reference clocks from the pair of first reference clocks, a pulse detector configured to generate a duty detection signal based on a phase difference between the pair of second reference clocks, a correction code generator configured to generate a reference correction code based on the duty detection signal, and an offset code generator configured to generate an offset code based on the reference correction code and a preset reference code.

35 Claims, 14 Drawing Sheets

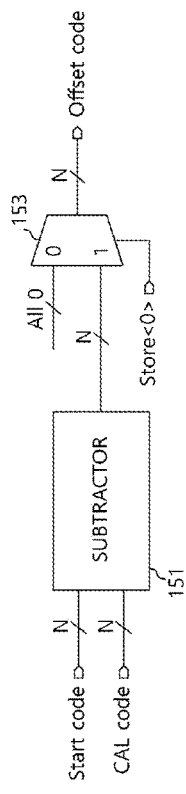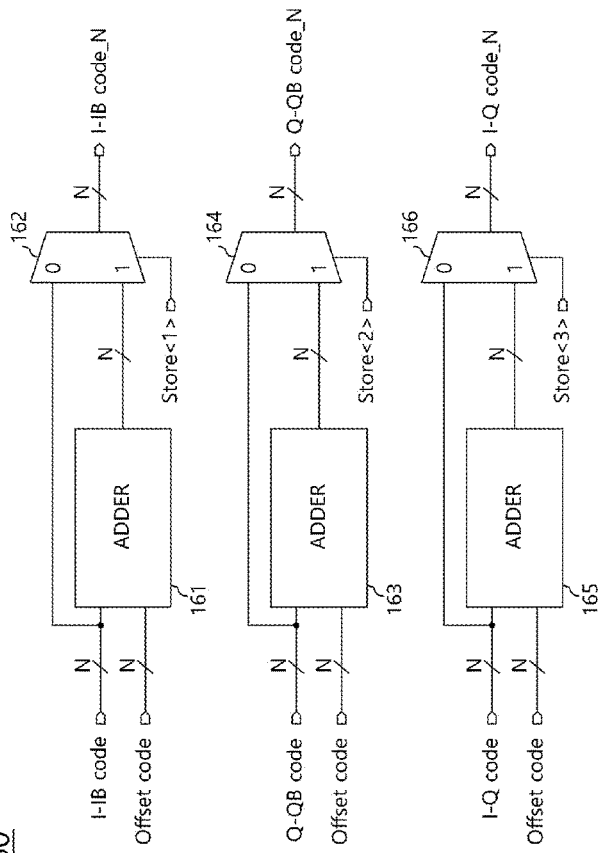

CLOCK GENERATION CIRCUIT AND METHOD AND SEMICONDUCTOR APPARATUS AND ELECTRONIC SYSTEM USING THE SAME

CROSS-REFERENCES TO RELATED APPLICATION

This application claims priority under 35 U.S.C. 119(a) to Korean application No. 10-2015-0095306, filed on Jul. 3, 2015, in the Korean intellectual property Office, which is incorporated by reference in its entirety as set forth in full.

BACKGROUND

1. Technical Field

Various embodiments of the inventive concept generally relate to a semiconductor integrated circuit device, and more particularly, to a clock generation circuit and method, and a semiconductor apparatus and electronic system using the same.

2. Related Art

Semiconductor apparatuses process data in synchronization with an external clock.

High-speed semiconductor apparatuses generate an internal clock in which the external clock is delayed for a certain time using a delay locked loop (DLL), and control the data to be accurately output at an edge of the external clock.

The semiconductor apparatuses may generate multiphase clock signals. The multiphase clock signals are generated by dividing the internal clock. The semiconductor apparatuses accurately output data at high speed in synchronization with the multiphase clock signals. Accordingly, data may be accurately output at high-speeds if the limits on the high-speed operation are improved.

The divided multiphase internal clocks have to be restored to the internal clock having an original period, and a duty of the restored clock may be affected by the phases of the divided multiphase internal clocks.

SUMMARY

According to an embodiment, there may be provided a clock generation circuit. The clock generation circuit may include: a reference clock generator configured to generate a pair of first reference clocks in an offset code generation mode; a triggering unit configured to generate a pair of second reference clocks from the pair of first reference clocks; a pulse detector configured to generate a duty detection signal based on a phase difference between the pair of second reference clocks; a correction code generator configured to generate a reference correction code based on the duty detection signal; and an offset code generator configured to generate an offset code based on the reference correction code and a preset reference code.

According to an embodiment, there may be provided a semiconductor apparatus. The semiconductor apparatus may include: a clock providing unit configured to generate a plurality of calibration clock signals from an external clock signal; and a data output unit configured to process data in response to the plurality of calibration clock signals. The clock providing unit may include: a reference clock generator configured to generate a pair of first reference clocks in an offset code generation mode; a triggering unit configured to generate a pair of second reference clocks from the pair of first reference clocks; a pulse detector configured to generate a duty detection signal based on a phase difference between the pair of second reference clocks; a correction code generator configured to generate a reference correction code based on the duty detection signal; and an offset code generator configured to generate an offset code based on the reference correction code and a preset reference code.

According to an embodiment, there may be provided a method of generating a clock. The method may include: generating an offset code based on a first reference clock in an offset code generation mode; generating a compensated correction code by compensating a correction code based on the offset code in a phase correction mode; and generating a plurality of calibration clock signals from a plurality of clock signals based on the compensated correction code.

According to an embodiment, there may be provided a method of generating a clock. The method may include: generating a pair of first reference clocks in an offset code generation mode; generating a pair of second reference clocks from the pair of first reference clocks; generating a duty detection signal based on a phase difference between the pair of second reference clocks; generating a reference correction signal based on the duty detection signal; and generating an offset code based on the reference correction code and a preset reference code.

According to an embodiment, there may be provided a clock generation circuit. The clock generation circuit may include a phase corrector configured to receive multiphase clock signals and correct the phases of the multiphase clock signals during a phase correction mode. Before the phase correction is performed on the multiphase clock signals and before the phase correction mode, the clock generation circuit may estimate an offset existing within the clock generation circuit and then may generate an offset code based on the estimated offset for correcting the phases of the multiphase clocks based on the generated offset code.

BRIEF DESCRIPTION OF THE DRAWINGS

FIG. 7 is a configuration diagram illustrating a representation of an example of an offset code generator according to an embodiment.

FIG. 8 is a configuration diagram illustrating a representation of an example of a compensator according to an.

DETAILED DESCRIPTION

Figure 1:
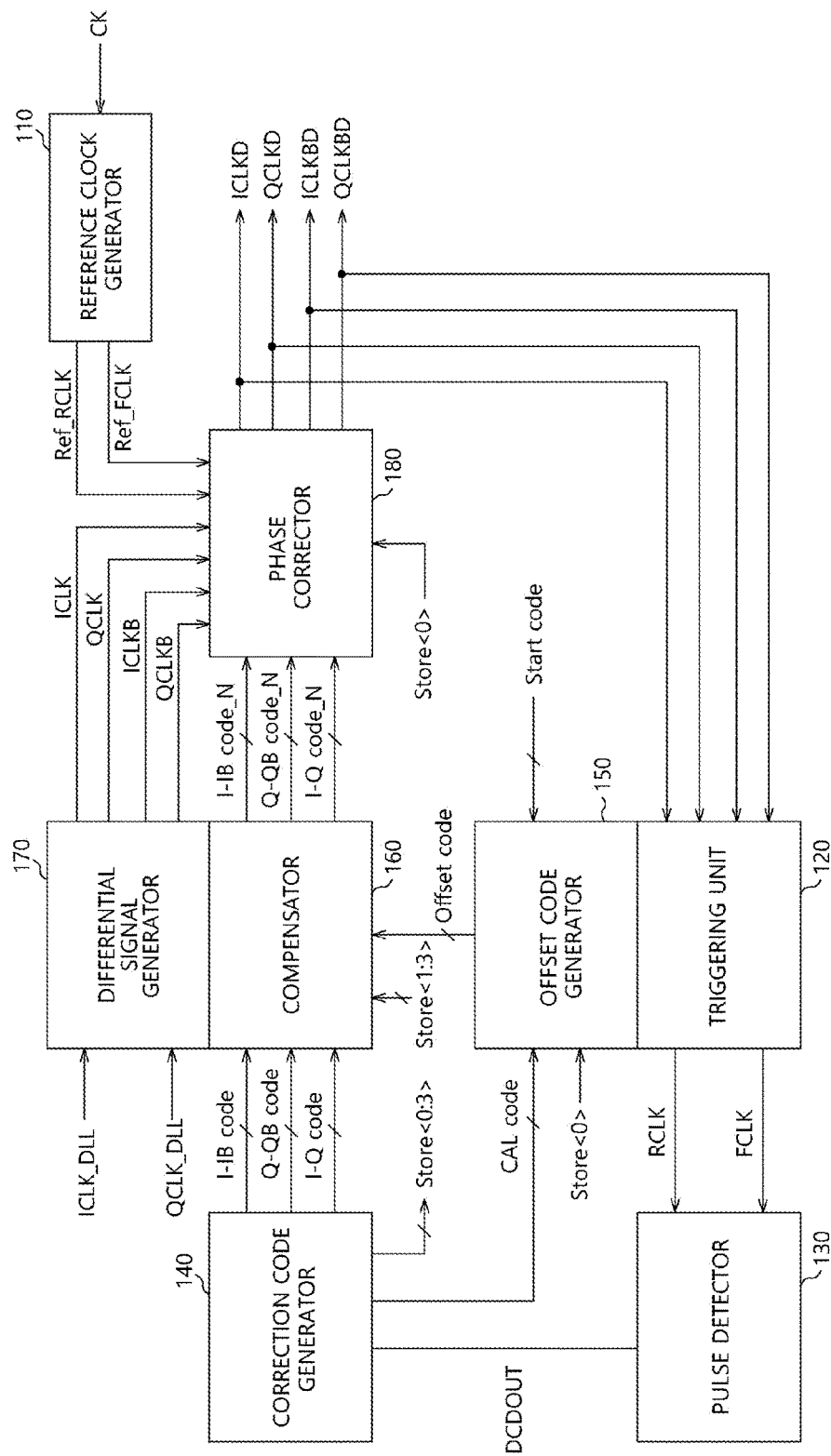
FIG. 1 is a configuration diagram illustrating a representation of an example of a clock generation circuit according to an embodiment.

Various examples of embodiments will be described below with reference to the accompanying drawings. Various examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

FIG. 1 is a configuration diagram illustrating a representation of an example of a clock generation circuit according to an embodiment.

A clock generation circuit 10 according to an embodiment may include a reference clock generator 110, a triggering unit 120, a pulse detector 130, a correction code generator 140, an offset code generator 150, a compensator 160, a differential signal generator 170, and a phase corrector 180.

In an embodiment, the clock generation circuit 10 may estimate an offset which may exist in the clock generation circuit 10 in advance before the phases for multiphase clock signals ICLK, QCLK, ICLKB, QCLKB generated through the differential signal generator 170 are corrected after locking of a delay locked loop (DLL). The clock generation circuit 10 may generate compensated correction codes I-IB code_N, Q-QB code_N, I-Q code_N by reflecting an offset code Offset code based on the estimated offset to correction codes I-IB code, Q-QB code, and I-Q code generated in the correction code generator 140. The clock generation circuit 10 may calibrate phases of the multiphase clock signals ICLK, QCLK, ICLKB, and QCLKB based on the compensated correction codes I-IB code_N, Q-QB code_N, and I-Q code_N.

An operation of generating the offset code Offset code may refer to an offset code generation mode, and an operation of calibrating the phases of the multiphase clocks ICLK, QCLK, ICLKB, and QCLK may refer to a phase correction mode.

Here, output signals RCLK and FCLK of the triggering unit 120 in the offset code generation mode may refer to a second rising reference clock RCLK and a second falling reference clock FCLK. The output signals RCLK and FCLK of the triggering unit 120 in the phase correction mode may refer to a rising clock signal RCLK and a falling clock signal FCLK. This is to divide operations of the offset code generation mode and the phase correction mode. The division of terms for the output signals RCLK and FCLK is because the second rising reference clock RCLK and the second falling reference clock FCLK in the offset code generation mode and the rising clock signal RCLK and the falling clock signal FCLK in the phase correction mode are substantially formed through the same path.

First, the offset code generation mode will be described.

After the DLL locking, the reference clock generator 110 may generate a pair of first reference clocks Ref_RCLK and Ref_FCLK having an accurate phase relationship in response to an internal clock signal CK. The pair of first reference clocks Ref_RCLK and Ref_FCLK may include a first rising reference clock Ref_RCLK and a first falling reference clock Ref_FCLK, and may be provided to the triggering unit 120 via the phase corrector 180.

The providing of the pair of first reference clocks Ref_RCLK and Ref_FCLK to the triggering unit 120 via the phase corrector 180 is to transmit the pair of first reference clocks Ref_RCLK and Ref_FCLK used in the offset code generation mode through the same path as a transmission path of the multiphase clock signals ICLK, QCLK, ICLKB, and QCLKB to be substantially phase-corrected. Accordingly, the pair of first reference clocks Ref_RCLK and Ref_FCLK may be transmitted to the triggering unit 120 through the same path as the transmission path of the multiphase clock signals ICLK, QCLK, ICLKB, and QCLKB to the triggering unit 120 via the phase-corrector 180.

The triggering unit 120 may generate the second rising reference clock RCLK which is rising in synchronization with a rising edge of the first rising reference clock Ref_RCLK and is falling in synchronization with a rising edge of the first falling reference clock Ref_FCLK. The triggering unit 120 may generate the second falling reference clock FCLK which is falling in synchronization with the rising edge of the first rising reference clock Ref_RCLK and is rising in synchronization with the rising edge of the first falling reference clock Ref-FCLK.

The second reference clocks RCLK and FCLK may be provided to the pulse detector 130, and the pulse detector 130 may generate a duty detection signal DCDOUT by detecting a phase difference between the second rising reference clock RCLK and the second falling reference clock FCLK. In an embodiment, when an offset may not exist in the phase corrector 180 and/or the triggering unit 120 or in a path from the phase corrector 180 to an output terminal of the triggering unit 120 due to a delay or the like, the second rising reference clock RCLK and the second falling reference clock FCLK may have the same pulse width. However, when an offset may exist in the phase corrector 180 and/or the triggering unit 120 or in the path from the phase corrector 180 to the output terminal of the triggering unit 120, the second rising reference clock RCLK and the second falling reference clock FCLK may have different pulse widths from each other.

The correction code generator 140 may generate a reference correction code CAL code in response to the duty detection signal DCDOUT.

The offset code generator 150 may generate the offset code Offset code based on a preset reference code Start code and the reference correction code CAL code.

That is, the clock generation circuit 10 according to an embodiment may generate the pair of second reference clocks RCLK and FCLK which synchronize with the pair of first reference clocks Ref_RCLK and Ref_FCLK having the accurate phase relationship. The clock generation circuit 10 may generate the reference correction code CAL code based on a duty ratio between the second reference clocks RCLF and FCLK. The reference correction code CAL code may be compared with the reference code Start code, and an offset code may be generated according to the comparison result.

When an offset may not exist in the phase corrector 180 and/or the triggering unit 120 or in the path from the phase corrector 180 to the output terminal of the triggering unit 120, the reference correction code CAL code which is identical with the reference code Start code may be generated. When the offset exists in the phase corrector 180 and/or the triggering unit 120 or in the path from the correction corrector 180 to the output terminal of the triggering unit 120, the reference correction code CAL code which is different from the reference code Start code may be generated, and a difference between reference correction code CAL code and the reference code Start code may be generated as the offset code Offset.

After the offset code Offset code is generated, the phase correction mode for the multiphase clock signals ICLK, QCLK, ICLKB, and QCLKB may be performed.

The phase correction operation for the multiphase clock signals ICLK, QCLK, ICLKB, and QCLKB may include an operation for generating a compensated first correction mode, an operation for generating a compensated second correction code, and an operation for generating a compensated third correction code.

A compensated first correction code I-IB code_N may be generated based on the first correction code I-IB code and the offset code Offset code. A compensated second correction code Q-QB code_N may be generated at the same time that the first compensated correction code I-IB code_N is output, and the compensated second correction code Q-QB code_N may be generated based on the second correction code Q-QB code and the offset code Offset code. A compensated third correction code I-Q code_N may be generated at the same time that the second compensated correction code Q-QB code_N is output, and the compensated third correction code I-Q code_N may be generated based on the third correction code I-Q code and the offset code Offset code. The compensated third correction code I-Q code_N may be output, and calibration for the first to fourth clock signals ICLK, ICLKB, QCLK, and QCLKB may be performed based on the compensated first to third correction codes I-IB code_N, Q-QB code_N, and I-Q code_N.

In an embodiment, the first clock signal ICLK may be delayed for a preset time, and then generated as a first calibration clock signal ICLKD. The second clock signal ICLKB may be delayed based on the compensated first correction code I-IB code_N, and then generated as a second calibration clock signal ICLKBD. The third clock signal QCLK may be delayed based on the compensated third correction code I-Q code_N, and then generated as a third calibration clock signal QCLKD. The fourth clock signal QCLKB may be delayed based on the compensated second correction code Q-QB code_N and the compensated third correction code I-Q code_N, and then generated as a fourth calibration clock signal QCLKBD.

The operations for generating the compensated first to third correction codes I-IB code_N, Q-QB code_N, and I-Q code_N may be substantially performed through the same method, and the operation of generating the compensated first correction code I-IB code_N and the phase correction operation for the second clock signal ICLKB, for example, through the generation operation will be described below.

After the DLL locking, the differential signal generator 170 may generate the first to fourth clock signals ICLK, ICLKB, QCLK, and QCLKB by generating differential signals for a locked first internal clock ICLK_DLL and a locked second internal clock QCLK_DLL.

The first to fourth clock signals ICLK, ICLKB, QCLK, and QCLKB may be provided to the phase corrector 180. The phase corrector 180 may generate the first to fourth calibration clock signals ICLKD, ICLKBD, QCLKD, and QCLKBD. The first to fourth calibration clock signals ICLKD, ICLKBD, QCLKD, and QCLKBD may be may be provided to the triggering unit 120.

The triggering unit 120 may generate the rising clock signal RCLK and the falling clock signal FCLK by triggering the first calibration clock signal ICLKD and the second calibration clock signal ICLKBD.

The pulse detector 130 may output the duty detection signal DCDOUT based on a duty ratio difference between the rising clock signal RCLK and the falling clock signal FCLK.

The correction code generator 140 may generate the first correction code I-IB code in response to the duty detection signal DCDOUT.

The compensator 160 may generate the compensated first correction code I-IB code_N by reflecting the previously generated offset code Offset code to the first correction code I-IB code generated in the correction code generator 140.

The phase corrector 180 may generate the first calibration clock signal ICLKD by delaying the first clock signal ICLK for a certain time. The phase corrector 180 may generate the second calibration clock signal ICLKBD by correcting a phase of the second clock signal ICLKB based on the compensated first correction code I-IB code_N.

The operations for generating the compensated second and third correction codes Q-QB code_N and I-Q code_N may be substantially performed through the same method.

That is, the compensated second correction code Q-QB code_N may be generated by compensating the second correction code Q-QB code by the offset code Offset code. Accordingly, the phase of the fourth clock signal QCLKB may be first-corrected.

The compensated third correction code I-Q code_N may be generated by compensating the third correction code I-Q code by the offset code Offset code. Accordingly, the third calibration clock signal QCLKD may be generated by correcting the phase of the third clock signal QCLK. Simultaneously, the fourth calibration clock signal QCLKB may be generated by second-correcting the phase of the first-corrected fourth clock signal QCLKB by the compensated third correction code I-Q code_N.

Before the phase correction is performed on the multiphase clock signals ICLK, ICLKB, QCLK, and QCLKB after the DLL locking, the clock generation circuit 10 of the embodiment may estimate the offset which may exist in the clock generation circuit 10, for example, in the phase corrector 180 and/or the triggering unit 120 or in the path from the phase corrector 180 to the output terminal of the triggering unit 120, and generate the offset code Offset code based on the estimated offset.

The clock generation circuit 10 may generate the compensated first to third correction codes I-IB code_N, Q-QB code_N, and I-Q code_N by reflecting the offset code Offset code to the first to third correction codes I-IB code, Q-QB code, and I-Q code. The clock generation circuit 10 may calibrate the phases of the multiphase clock signals based on the compensated first to third correction codes I-IB code_N, Q-QB code_N, and I-Q code-N.

Figure 2:
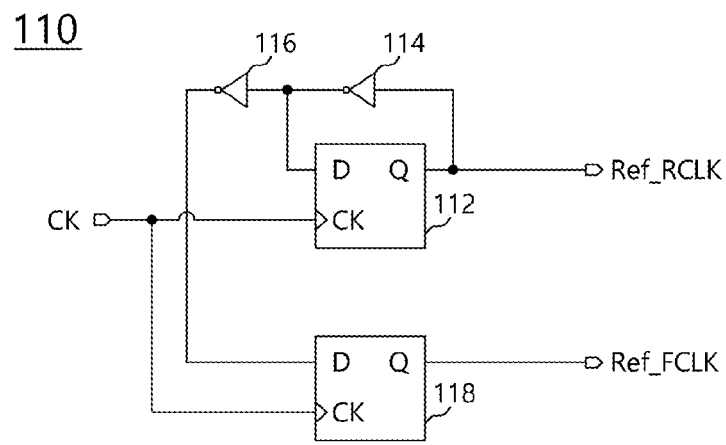
FIG. 2 is a configuration diagram illustrating a representation of an example of a reference clock generator according to an embodiment.
Figure 3:
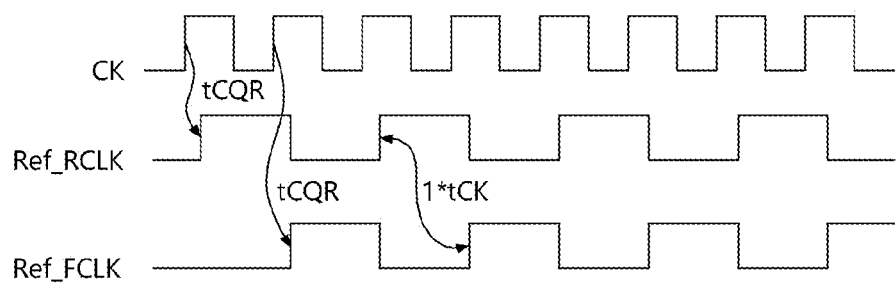
FIG. 3 is a timing diagram illustrating a representation of an example of an operation of the reference clock generator illustrated in FIG. 2.

FIG. 2 is a configuration diagram illustrating a representation of an example of a reference clock generator according to an embodiment, and FIG. 3 is a representation of an example of an operation timing diagram of the reference clock generator illustrated in FIG. 2.

The reference clock generator 110 may be configured to generate the first rising reference clock Ref_RCLK and the first falling reference clock Ref_FCLK having the accurate phase relationship.

In an embodiment, the reference clock generator 110 may include a rising reference clock generation unit 112 and a falling reference clock generation unit 118.

The rising reference clock generation unit 112 may generate the first rising reference clock Ref-RCLK in response to the internal clock signal CK by inputting a signal of an output node thereof to an input node thereof through a first inversion unit 114.

The falling reference clock generation unit 118 may generate the first falling reference clock Ref-FCLK in response to the internal clock signal CK by inputting the signal of the output node of the rising reference clock generation unit 112 to an input node thereof through the first inversion unit 114 and a second inversion unit 116.

The rising reference clock generation unit 112 and the falling reference clock generation unit 118 may be configured to have the same delay amount or substantially the same delay amount. For example, the rising reference clock generation unit 112 and the falling reference clock generation unit 118 may be configured to include D flip-flops, but this is not limited thereto.

It can be seen from FIG. 3 that the first rising reference clock Ref_RCLK and the first falling reference clock Ref_FCLK may be generated in response to the internal clock signal CK. The first rising reference clock Ref_RCLK and the first falling reference clock Ref_FCLK may be output through delay by a delay amount tCQR of the rising and falling reference clock generations 112 and 118. The first rising reference clock Ref_RCLK and the first falling reference clock Ref_FCLK may have an accurate phase difference of one cycle (1*tCK) of the internal clock signal.

Figure 4A:
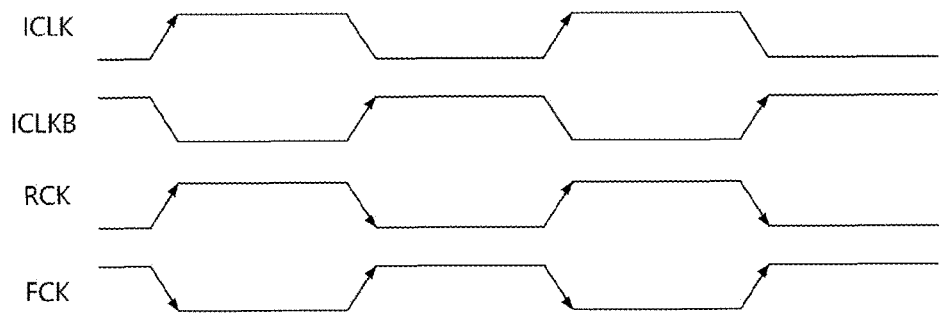
FIGS. 4A to 4C are waveform diagrams illustrating representations of examples of a clock signal generated from a triggering unit according to an embodiment.
Figure 4B:
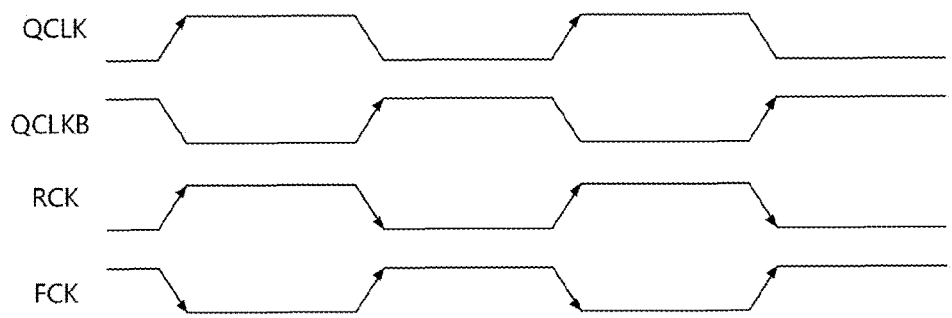
Figure 4C:
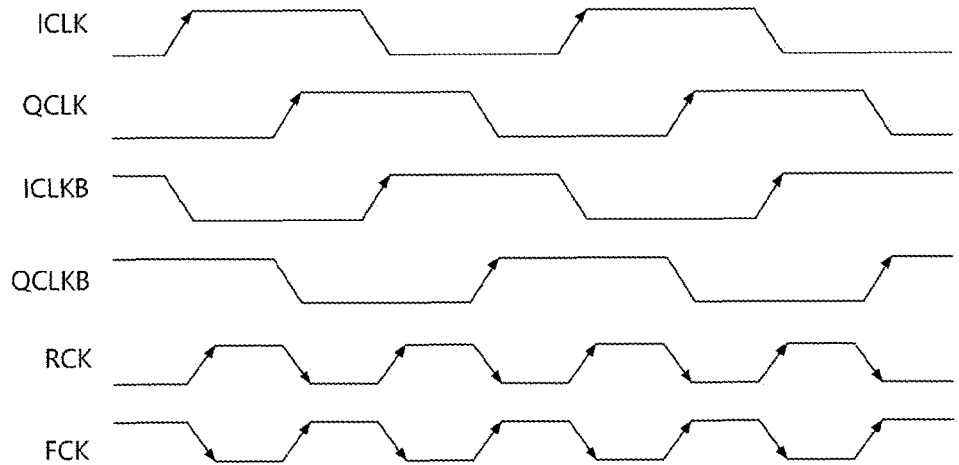

FIGS. 4A to 4C are waveform diagrams illustrating a representation of an example of clock signals generated from a triggering unit.

The triggering unit 120 may generate the second reference clocks RCLK and FCLK from the first reference clocks Ref_RCLK and Ref_FCLK in the offset code generation operation. The triggering unit 120 may receive the first to fourth calibration clock signals ICLKD, ICLKBD, QCLKD, and QCLKBD and generate the rising clock signal RCLK and the falling clock signal FCLK in the phase correction operation.

In the phase correction operation, as illustrated in FIG. 4A, the triggering unit 120 may generate the rising clock signal RCLK and the falling clock signal FCLK from the first clock signal ICLK and the second clock signal ICLKB.

As illustrated in FIG. 4B, the triggering unit 120 may generate the rising clock signal RCLK and the falling clock signal FCLK from the third clock signal QCLK and the fourth clock signal QCLKB.

As illustrated in FIG. 4C, the triggering unit 120 may generate the rising clock signal RCLK and the falling clock signal FCLK from the first to fourth clock signals ICLK, ICLKB, QCLK, and QCLKB.

Figure 5:
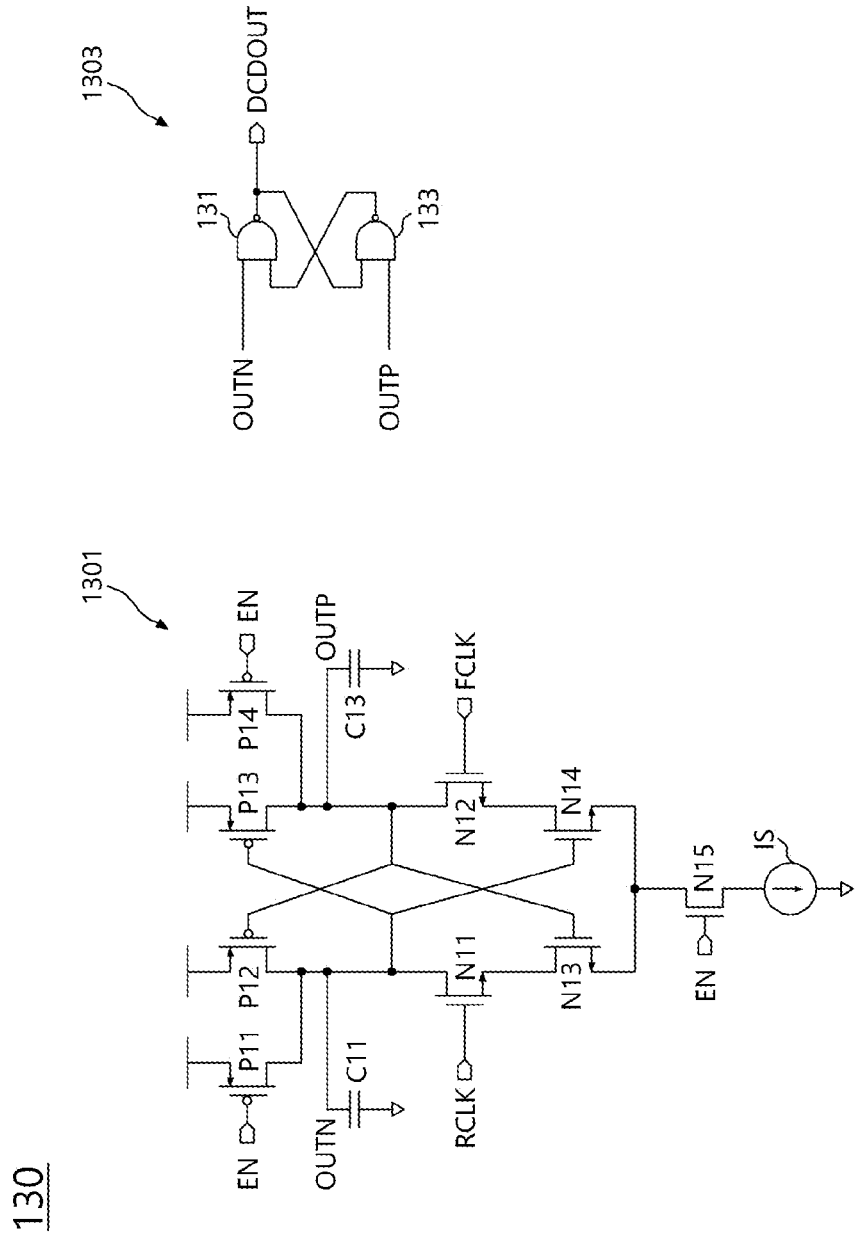
FIG. 5 is a configuration diagram illustrating a representation of an example of a pulse detector according to an embodiment.

FIG. 5 is a configuration diagram illustrating a representation of an example of a pulse detector according to an embodiment.

The pulse detector 130 according to an embodiment may accumulate charges in signal storage units C11 and C13 for a period in which the rising clock signal RCLK and the falling clock signal FCLK generated from the triggering unit 120 are a logic low level. The pulse detector 130 may drop voltage levels of signal storage nodes OUTN and OUTP through a discharging operation for a period in which the rising clock signal RCLK and the falling clock signal FCLK are a logic high level. The pulse detector 130 may generate the duty detection signal DCDOUT by detecting a voltage difference when the voltage difference between the signal storage nodes OUTN and OUTP is significantly large.

In an embodiment, the pulse detector 130 may be configured to include an amplifier 1301 and the comparator 1303 as illustrated in FIG. 5.

The amplifier 1301 may include a first switching element P11 and a fourth switching element P14 configured to operate the amplifier 1301 in response to a driving signal EN.

A second switching element P12 may be coupled between a power voltage terminal and the first signal storage node OUTN, and driven according to a voltage level applied to the second signal storage node OUTP. A third switching element P13 may be coupled between the power voltage terminal and the second signal storage node OUTP, and driven according to a voltage level applied to the first signal storage node OUTN.

The first and second signal storage units C11 and C13 may be configured of capacitors having the same charge capacity or substantially the same charge capacity.

A fifth switching element N11 may be coupled to the first signal storage node OUTN and driven in response to the rising clock signal RCLK. A sixth switching element N12 may be coupled to the second signal storage node OUTP and driven in response to the falling clock signal FCLK.

A seventh switching element N13 may have one end coupled to the fifth switching element N11 in series and may be driven according to the potential level applied to the second signal storage node OUTP. An eighth switching element N14 may have one end coupled to the sixth switching element N12 in series and may be driven according to the potential level applied to the first signal storage node OUTN.

A ninth switching element N15 driven according to the driving signal EN and a current source IS may be coupled between the other ends of the seventh and eighth switching elements N13 and N14 and a ground terminal.

Accordingly, the amplifier 1301 may be driven by the driving signal EN, and charges may be accumulated in the signal storage units C11 and C13 for the period in which the rising clock signal RCLK and the falling clock signal FCLK are a logic low level. The voltages of the signal storage nodes OUTN and OUTP may be dropped for the period in which the rising clock signal RCLK and the falling clock signal FCLK are a logic high level. Accordingly, potential levels corresponding to a pulse width difference between the rising clock signal RCLK and the falling clock signal FCLK may be applied to the first and second signal storage nodes OUTN and OUTP.

The comparator 1303 may output the duty detection signal DCDOUT by comparing the voltage levels of the first and second signal storage nodes OUTN and OUTP when the voltage level difference between the first and second signal storage nodes OUTN and OUTP is significantly large. For example, the comparator 1303 may have a latch structure using NAND gates 131 and 133, for example, a SR latch structure, but the structure of the comparator 1303 is not limited thereto.

Figure 6A:
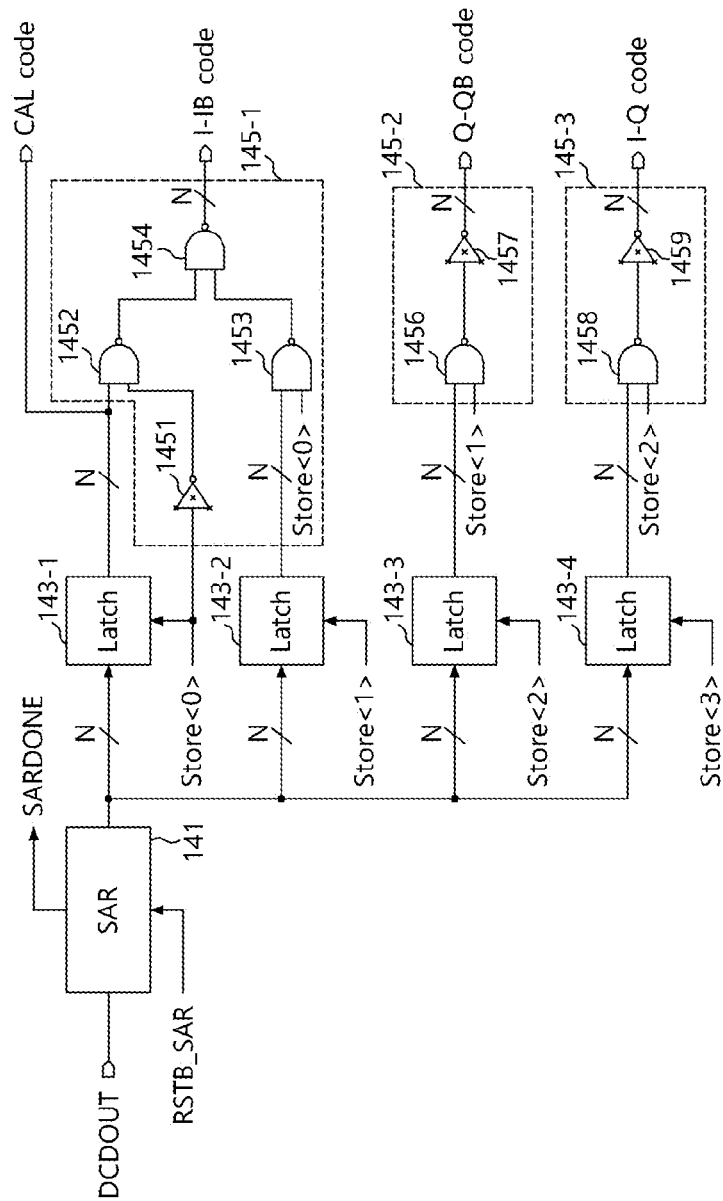
FIGS. 6A to 6C are configuration diagrams illustrating a representation of an example of a correction code generator according to an embodiment.
Figure 6B:
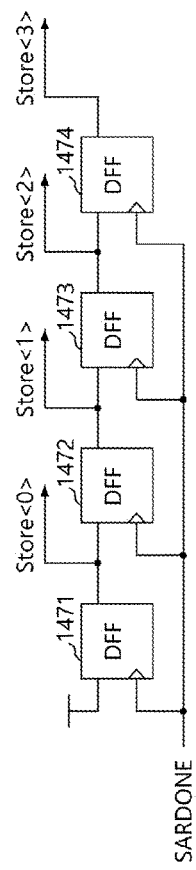
Figure 6C:
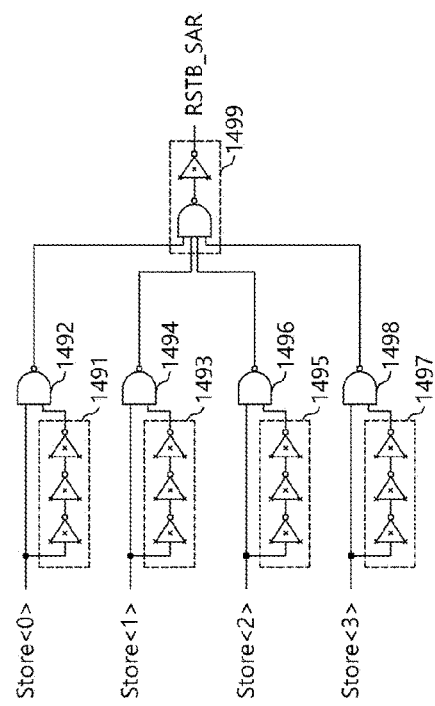

FIGS. 6A to 6C are configuration diagrams illustrating a representation of an example of a correction code generator according to an embodiment.

FIG. 6A illustrates a representation of an example of the correction code generator 140. The correction code generator 140 may be configured to generate the reference correction code CAL code in the offset code generation operation and generate the first to the third correction codes I-IB code, Q-QB code, and I_Q code in the phase correction operation.

In an embodiment, the correction code generator 140 may include, for example but not limited to, a successive approximate register (SAR) 141 configured to generate a control signal SARDONE by receiving the duty detection signal DCDOUT, convert the duty detection signal DCDOUT to an N-bit signal, and output the converted N-bit signal (i.e., N).

The correction code generator 140 may further include a store signal generation unit 147 and a strobe signal generation unit 149 as illustrated in FIGS. 6B and 6C.

Referring to FIG. 6B, the store signal generation unit 147 may generate store signals Store<0:3> in response to the control signal SARDONE. In an embodiment, the store signal generation unit 147 may include a plurality of delay units 1471, 1472, 1473, and 1474 which are coupled in series, are driven according to the control signal SARDONE, and use a power voltage signal as input signals.

The control signal SARDONE may be a pulse signal generated in a predetermined period, and may be configured to be generated in the phase correction mode.

First to fourth store signals Store<0:3> may be output from output terminals of the delay units 1471, 1472, 1473, and 1474. Accordingly, the first to fourth store signals Store<0:3> may be sequentially enabled when the control signal SARDONE as a pulse signal is output.

Referring to FIG. 6C, the strobe signal generation unit 149 may be configured to generate a strobe signal RSTB_SAR whenever the store signals Store<0:3> are sequentially enabled. In an embodiment, the strobe signal generation unit 149 may include first to fourth inversion delay units 1491, 1493, 1495, and 1497 and first to fourth pulse generation units 1492, 1494, 1496, and 1498, and an output unit 1499.

The first inversion delay unit 1491 may inversion-delay the first store signal Store<0>. The first pulse generation unit 1492 may generate a first strobe pulse from the first store signal Store<0> and the inversion-delayed first store signal.

The second inversion delay unit 1493 may inversion-delay the second store signal Store<1>. The second pulse generation unit 1494 may generate a second strobe pulse from the second store signal Store<1> and the inversion-delayed second store signal.

The third inversion delay unit 1495 may inversion-delay the third store signal Store<2>. The third pulse generation unit 1496 may generate a third strobe pulse from the third store signal Store<2> and the inversion-delayed third store signal.

The fourth inversion delay unit 1497 may inversion-delay the fourth store signal Store<3>. The fourth pulse generation unit 1498 may generate a fourth strobe pulse from the fourth store signal Store<3> and the inversion-delayed fourth store signal.

The output unit 1499 may generate the strobe signal RSTB_SAR from the first to fourth strobe pulses generated from the first to fourth pulse generation units 1492, 1494, 1496, and 1498.

Referring back to FIG. 6A, the correction code generator 140 may include the SAR 141, first to fourth latches 143-1, 143-2, 143-3, and 143-4, and first to third output units 145-1, 145-2, and 145-3. The SAR 141 may receive the strobe signal RSTB_SAR.

The N-bit signal output from the SAR 141 may be temporarily stored in the first to fourth latches 143-1, 143-2, 143-3, and 143-4.

When all the store signals Store<0:3> are disabled, an N-bit out signal of the first latch 143-1 may be output as the reference correction code CAL code.

The second store signal Store<1> may be enabled after a predetermined time elapsed in a state in which the first store signal Store<0> is enabled, and the first output unit 145-1 may generate the first correction code I-IB code from the N-bit signal stored in the first latch 143-1 and the N-bit signal stored in the second latch 143-2.

The third store signal Store<2> may be enabled after a predetermined time elapsed in a state in which the first store signal Store<0> and the second store signal Store<1> are enabled, and the second output unit 145-2 may generate the second correction code Q-QB code from the N-bit signal stored in the third latch 143-3.

The fourth store signal Store<3> may be enabled after a predetermined time elapsed in a state in which the first store signal Store<0>, the second store signal Store<1>, the third store signal Store<2> are enabled, and the third output unit 145-3 may generate the third correction code I-Q code from the N-bit signal stored in the fourth latch 143-4.

In an embodiment, the first output unit 145-1 may include a first inversion unit 1451, a first comparison unit 1452, and a second comparison unit 1453, and a combination unit 1454. The first inversion unit 1451 may be configured to invert the first store signal Store<0>. The first comparison unit 1452 may be configured to compare an output signal of the first latch 143-1 and an output unit of the first inversion unit 1451. The second comparison unit 1453 may be configured to compare an output signal of the second latch 143-2 and the first store signal <0>. The combination unit 1454 may be configured to generate the first correction code I-IB code by combining output signals of the first comparison unit 1452 and the second comparison unit 1453.

In an embodiment, the second output unit 145-2 may include a third comparison unit 1456 configured to compare an output signal of the third latch 143-3 and the second store signal Store<1> and a second inversion unit 1457 configured to generate the second correction code Q-QB code by inverting an output signal of the third comparison unit 1456.

In an embodiment, the third output unit 145-3 may include a fourth comparison unit 1458 configured to compare an output signal of the fourth latch 143-4 and the third store signal Store<2> and a third inversion unit 1459 configured to generate the third correction code I-Q code by inverting an output signal of the fourth comparison unit 1458.

Accordingly, in the offset code generation mode that all the store signals Store<0:3> are disabled, the reference correction code CAL code may be generated, and the offset code generation operation may be performed.

In the phase correction mode, the first correction code I-IB code may be generated when the first store signal Store<0> and the second store signal Store<1> are sequentially enabled, the second correction code Q-QB code may be generated when the third store signal Store<2> is enabled, and the third correction code I-Q code may be generated when the fourth store signal Store<3> is enabled.

FIG. 7 is a configuration diagram illustrating a representation of an example of an offset code generator according to an embodiment.

Referring to FIG. 7, the offset code generator 150 according to an embodiment may include a subtractor 151 and an output unit 153.

The subtractor 151 may perform an operation on a difference between the N-bit reference code Start code and the N-bit reference correction code CAL code.

The output unit 153 may output an output signal of the subtractor 151 as the offset code Offset code in response to the first store signal Store<0>.

Accordingly, the offset code Offset code may have been stored in the output unit 153 in the offset code generation mode and may not be output until the clock generation circuit enters the phase correction mode. When the clock generation circuit 10 enters the phase correction mode, and then the first store signal Store<0> is enabled, the offset code Offset code may be output from the offset code generator 150 and provided to the compensator 160.

FIG. 8 is a configuration diagram illustrating a representation of an example of a compensator according to an embodiment.

The compensator 160 according to an embodiment may be configured to include first to third adders 161, 163, and 165 and first to third output units 162, 164, and 166.

The first adder 161 may perform, for example, an add operation to reflect the offset code Offset code to the first correction code I-IB code. The first output unit 162 may output one of the first correction code I-IB code and an output signal of the first adder 161 as the compensated first correction code I-IB code_N in response to the second store signal Store<1>.

The second adder 163 may perform, for example, an add operation to reflect the offset code Offset code to the second correction code Q-QB code. The second output unit 164 may output one of the second correction code Q-QB code and an output signal of the second adder 163 as the compensated second correction code Q-QB code_N in response to the third store signal Store<2>.

The third adder 165 may perform, for example, an add operation to reflect the offset code to the third correction code I-Q code. The third output unit 166 may output one of the third correction code I-Q code and an output signal of the third adder 165 as the compensated third correction code I-Q code_N in response to the fourth store signal Store<3>.

Accordingly, when the first store signal Store<0> is enabled, the offset code Offset code may be output from the offset code generator 150, and provided to the compensator 160. The compensated first correction code I-IB code_N in which the offset code Offset code is reflected to the first correction code I-IB code through the first adder 161 may be calculated.

When the second store signal Store<1> is enabled, the compensated first correction code I-IB code_N provided from the first adder 161 may be output through the first output unit 162. Simultaneously, the compensated second correction code Q-QB code_N in which the offset code Offset code is reflected to the second correction code Q-QB code through the second adder 163 may be calculated.

When the third store signal Store<2> is enabled, the compensated second correction code Q-QB code_N provided from the second adder 163 may be output through the second output unit 164. Simultaneously, the compensated third correction code I-Q code_N in which the offset code Offset code is reflected to the third correction code I-Q code through the third adder 165 may be calculated.

When the fourth store signal Store<3> is enabled, the compensated third correction code I-Q code_N provided from the third adder 165 may be output through the third output unit 166.

Figure 9:
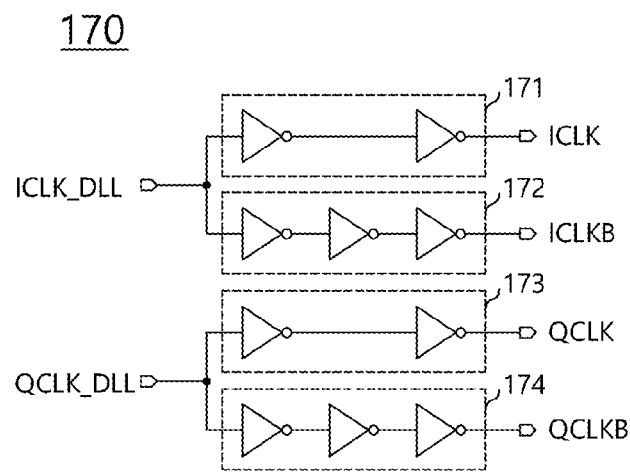
FIG. 9 is a configuration diagram illustrating a representation of an example of a differential signal generator according to an embodiment.

FIG. 9 is a configuration diagram illustrating a representation of an example of a differential signal generator according to an embodiment.

The differential signal generator 170 according to an embodiment may operate after the DLL locking, and may include a first signal generation unit 171, a second signal generation unit 172, a third signal generation unit 173, and a fourth signal generation unit 174.

The first signal generation unit 171 may be configured to generate the first clock signal ICLK from the locked first internal clock ICLK_DLL.

The second signal generation unit 172 may be configured to generate the second clock signal ICLKB having an opposite phase to the first clock signal ICLK from the locked first internal clock ICLK_DLL.

The third signal generation unit 173 may be configured to generate the third clock signal QCLK from the locked second internal clock QCLK_DLL which is delayed from the locked first internal clock ICLK_DLL for a certain time.

The fourth signal generation unit 174 may be configured to generate the fourth clock signal QCLKB having an opposite phase to the third clock signal QCLK from the locked second internal clock QCLK_DLL.

In an embodiment, the first to fourth signal generation units 171, 172, 173, and 174 may be designed to have the same delay time or substantially the same delay time.

The offset code Offset code may be generated through the above-described offset code generation process, and the compensated first to third correction codes I-IB code_N, Q-QB code_N, and I-Q code_N may generated by reflecting the offset code Offset code to the first to third correction codes I-IB code, Q-QB code, and I-Q code. The first to fourth clock signals ICLK, ICLKB, QCLK, and QCLKB may be generated from the differential signal generator 170 illustrated in FIG. 9. The phase corrector 180 may generate the first to fourth calibration clock signals ICLKD, ICLKBD, QCLKD, and QCLKBD by correcting the phases of the first to fourth clock signals ILCK, ICLKB, QCLK, and QCLKB based on the compensated first to third correction codes I-IB code_N, Q-QB code_N, and I-Q code_N.

Figure 10:
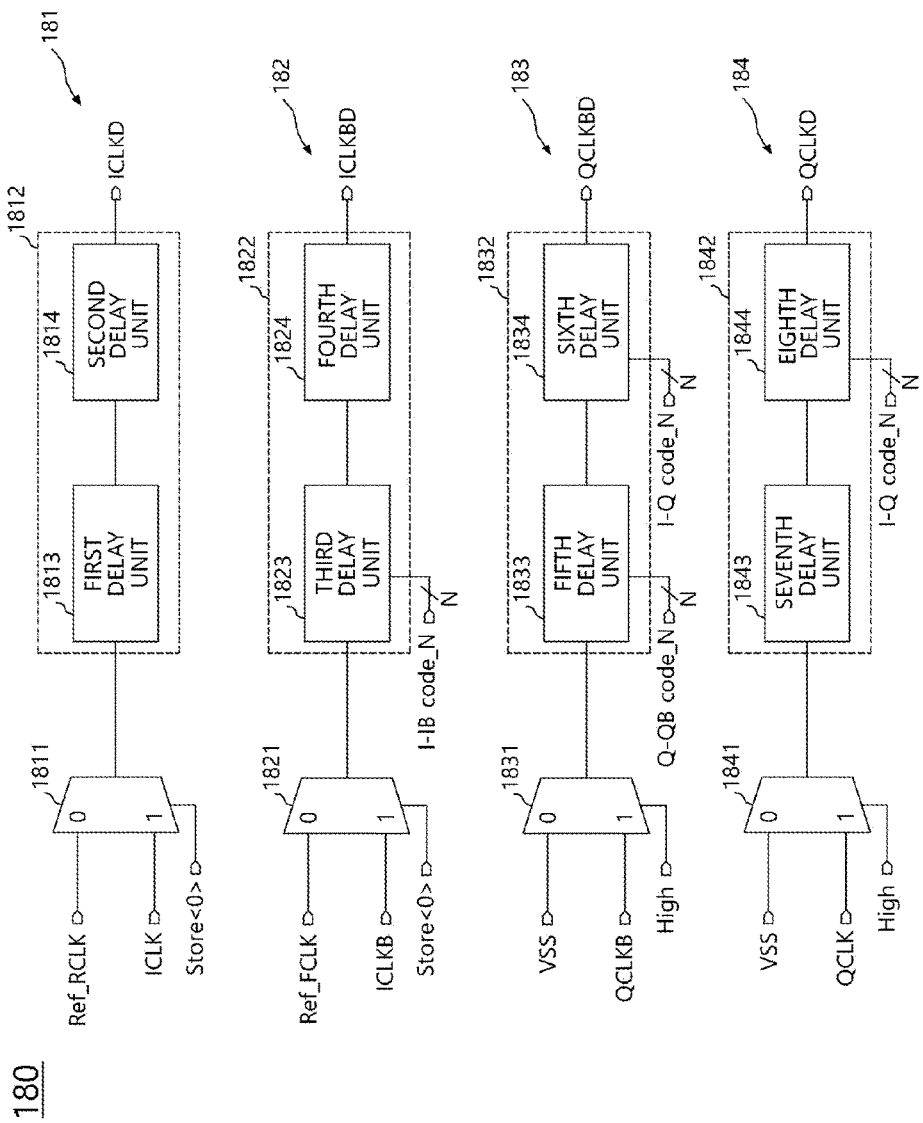
FIG. 10 is a configuration diagram illustrating a representation of an example of a phase corrector according to an embodiment.

FIG. 10 is a configuration diagram illustrating a representation of an example of a phase corrector according to an embodiment.

The phase corrector 180 according to an embodiment may include a first calibration unit 181, a second calibration unit 182, a third calibration unit 183, and a fourth calibration unit 184.

The first calibration unit 181 may include a first selector 1811 and a first delay circuit 1812. The first selector 1811 may select one of the first rising reference clock Ref_RCLK and the first clock signal ICLK as an output signal in response to the first store signal Store<0>. When all the store signals Store<0:3> are disabled, that is, in the offset code generation mode, the first selector 1811 may select the first rising reference clock Ref_RCLK and output the selected first rising reference clock Ref_RCLK. In the phase correction mode in which the first store signal store<0> becomes a high level, the first selector 1811 may select the first clock signal ICLK and output the selected first clock signal ICLK. The first delay circuit 1812 may output the first calibration clock signal ICLKD by delaying the output signal of the first selector 1811 for a certain time. The first delay circuit 1812 may include first and second delay units 1813 and 1814 having predetermined delay values, but the first delay circuit 1812 is not limited thereto.

The second calibration unit 182 may include a second selector 1821 and a second delay circuit 1822. The second selector 1821 may select one of the first falling reference clock Ref_FCLK and the second clock signal ICLKB as an output signal in response to the first store signal Store<0>. When all the store signals Store<0:3> are disabled, that is, in the offset code generation mode, the second selector 1821 may select the first falling reference clock Ref_FCLK and output the selected first falling reference clock Ref_FCLK. In the phase correction mode in which the first store signal store<O> becomes a high level, the second selector 1821 may select the second clock signal ICLKB and output the selected second clock signal ICLKB. The second delay circuit 1822 may output the second calibration clock signal ICLKBD by delaying the output signal of the second selector 1821 in response to the compensated first correction code I-IB code_N. The second delay circuit 1822 may include a third delay unit 1823 configured to delay the output signal of the second selector 1821 by a time determined by the compensated first correction code I-IB code_N. The second delay circuit 1822 may further include a fourth delay unit 1824 configured to output the second calibration clock signal ICLKBD by delaying an output signal of the third selector 1823 by a predetermined time. The delay order of the third delay unit 1823 and the fourth delay unit 1824 are not limited thereto.

The third calibration unit 183 may include a third selector 1831 and a third delay circuit 1832. The third selector 1831 may be configured to output the fourth clock signal QLCKB. The third delay circuit 1832 may include a fifth delay unit 1833 configured to first-correct the fourth clock signal QCLKB by the compensated second correction code Q-QB code_N and a sixth delay unit 1834 configured to generate the fourth calibration clock signal QCLKBD by second-correcting the fourth clock signal QCLKB by the compensated third correction code I-Q code_N.

The fourth calibration unit 184 may include a fourth selector 1841 and a fourth delay circuit 1842. The fourth selector 1841 may be configured to output the third clock signal QLCK. The fourth delay circuit 1842 may include a seventh delay unit 1843 configured to delay the third clock signal QCLK during the first correction for the fourth clock signal QCLKB and an eighth delay unit 1844 configured to generate the third calibration clock signal QCLKD by correcting the third clock signal QCLK by the compensated third correction code I-Q code_N.

While the first clock signals ICLK is delayed for a predetermined time through the first delay unit 1813, the phase corrector 180 may delay the second clock signal ICLKB by the compensated first correction code I-IB code_N through the third delay unit 1823, delay the fourth clock signal QCLKB by the compensated second correction code Q-QB code_N through the fifth delay unit 1833, and delay the third clock signal QCLK for a predetermined time through the seventh delay unit 1843.

The phase corrector 180 may generate the first calibration clock signal ICLKD by delaying the first clock signal ICLK for a predetermined time through the second delay unit 1814, and simultaneously the phase corrector 180 may generate the second calibration clock signal ICLKDB by delaying the output signal of the third delay unit 1823 for a predetermined time through the fourth delay unit 1824, generate the fourth calibration clock signal QCLKBD by delaying the output signal of the fifth delay unit 1833 by the compensated third correction code I-Q code_N through the sixth delay unit 1834, and generate the third calibration clock signal QCLKD by delaying the output signal of the seventh delay unit 1843 by the compensated third correction code I-Q code_N through the eighth delay unit 1844.

Figure 11:
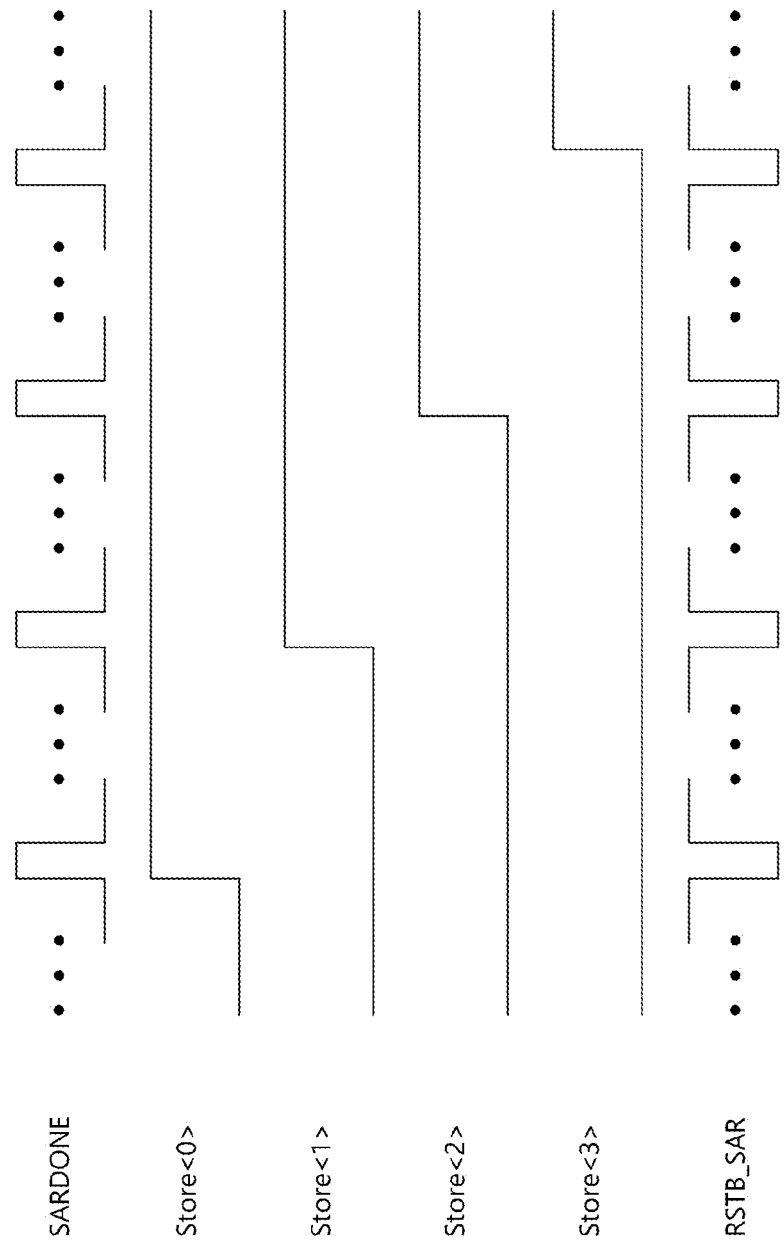
FIG. 11 is a timing diagram illustrating a representation of an example of a control signal and a store signal generated in a correction code generator according to an embodiment.

FIG. 11 is a timing chart illustrating a representation of an example of a control signal and a store signal generated in a correction code generator. The phase correction operation of the clock generation circuit according to an embodiment will be described with reference to FIGS. 1 to 10 together with FIG. 11 below. FIG. 11 also illustrates strobe signal RSTB_SAR.

In the offset code generation mode, that is, before the control signal SARDONE is generated in the SAR 141, all the store signals Store<0:3> are in the disabled state.

The pulse detector 130 may generate the duty detection signal DCDOUT according to a pulse width difference between the pair of second reference clocks RCLK and the FCLK generated from the pair of first reference clocks Ref_RCLK and Ref_FCLK having the accurate phase relationship. The correction code generator 140 may generate the reference correction code CAL code from the duty detection signal DCDOUT.

Accordingly, the offset code generator 150 may generate the offset code Offset code through comparison between the reference correction code CAL code and the reference code Start code.

When the control signal SARDONE starts to be generated and the first store signal Store<0> is enabled, the correction code generator 140 may generate the first correction code I-IB code, and the compensator 160 may calculate the compensated first correction code I-IB code_N by reflecting the offset code Offset code to the first correction code I-IB code.

When the second store signal Store<1> is enabled, the compensator 160 may output the compensated first correction code I-IB code_N. The correction code generator 140 may generate the second correction code Q-QB code, and the compensator 160 may calculate the compensated second correction code Q-QB code_N by reflecting the offset code Offset code to the second correction code Q-QB code.

When the third store signal Store<2> is enabled, the compensator 160 may output the compensated second correction code Q-QB code_N. The correction code generator 140 may generate the third correction code I-Q code, and the compensator 160 may calculate the compensated third correction code I-Q code_N by reflecting the offset code Offset code to the third correction code I-Q code.

When the fourth store signal Store<3> is enabled, the compensator 160 may output the compensated third correction code I-Q code_N.

The phase corrector 180 may receive the compensated first to third correction codes I-IB code_N, Q-QB code_N, and I-Q code_N, and generate the first to fourth calibration clock signals ICLKD, ICLKBD, QCLKD, and QCLKBD by correcting the phases of the first to fourth clock signals ICLK, ICLKB, QCLK, and QCLKB.

In an embodiment, the first clock signal ICLK may be delayed for a preset time, and then generated as the first calibration clock signal ICLKD.

The second clock signal ICLKB may be delayed for a time based on the compensated first correction code I-IB code_N, and then generated as the second calibration clock signal ILCKBD.

The third clock signal QCLK may be delayed for a time based on the compensated third correction code I_Q code_N, and then generated as the third calibration clock signal QCLKD.

The fourth clock signal QCLKD may be delayed for a time based on the compensated second correction code Q-QB code_N and the compensated third correction code I-Q code_N, and then generated as the fourth calibration clock signal QCLKBD.

The delay time of the phase corrector 180 may be controlled so that the first to fourth calibration clock signals ICLKD, ICLKBD, QCLKD, and QCLKBD may be output at the same point of time.

Figure 12:
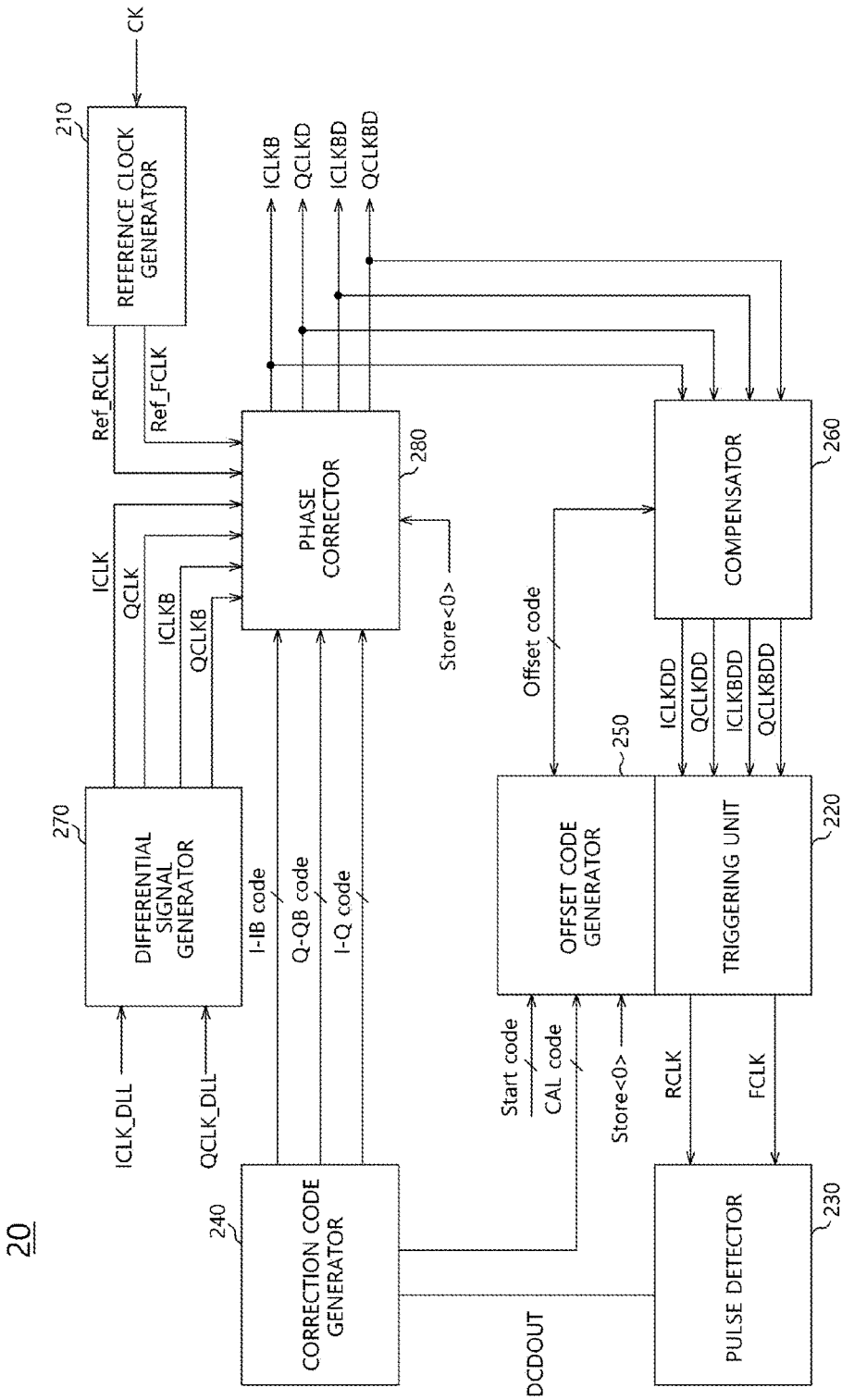
FIG. 12 is a configuration diagram illustrating a representation of an example of a clock generation circuit according to an embodiment.

FIG. 12 is a configuration diagram illustrating a representation of an example of a clock generation circuit according to an embodiment.

Referring to FIG. 12, a clock generation circuit 20 may include a reference clock generator 210, a triggering unit 220, a pulse detector 230, a correction code generator 240, an offset code generator 250, a compensator 260, a differential signal generator 270, and a phase corrector 280.

In an embodiment, the clock generation circuit 20 may generate an offset code Offset code through the same method as a method used in the first clock generation circuit 10 illustrated in FIG. 1. That is, in the offset code generation mode, a pair of first reference clocks Ref-RCLK and Ref_FCLK may be provided to the triggering unit 220 via the phase corrector 280 and the compensator 260, and the triggering unit 220 may generate a pair of second reference clocks RCLK and FCLK. The pulse detector 230 may generate a duty detection signal DCDOUT by detecting a pulse width difference between the pair of second reference clocks RCLK and FCLK. In an embodiment, an offset may exist in the phase corrector 280 and/or the triggering unit 220 or in a path from the phase corrector 280 through the compensator 260 and ending at an output terminal of the triggering unit 220. The correction code generator 240 may generate a reference correction code CAL code based on the duty detection signal DCDOUT. The offset code generator 250 may generate the offset code Offset code through comparison between the reference correction code CAL code and a preset reference code Start code.

When the offset code Offset code is generated, the clock generation circuit 20 may correct the first to fourth calibration clock signals ICLKD, ICLKBD, QCLKD, and QCLKBD using the offset code Offset code in the phase correction mode.

Specifically, the differential signal generator 270 may generate first to fourth clock signals ICLK, ICLKB, QCLK, and QCLKB by generating differential signals from a pair of locked internal clocks ICLK_DLL and QCLK_DLL after the DLL locking. The first to fourth clock signals ICLK, ICLKB, QCLK, and QCLKB may be provided to the phase corrector 280, and the phase corrector 280 may generate the first to fourth calibration clock signals ICLKD, ICLKBD, QCLKD, and QCLKBD. The first to fourth calibration clock signals ICLKD, ICLKBD, QCLKD, and QCLKBD may be provided to the compensator 260.

The compensator 260 may generate first to fourth correction clock signals ICLKDD, ICLKBDD, QCLKDD, and QCLKBDD by correcting the first to fourth calibration clock signals ICLKD, ICLKBD, QCLKD, and QCLKBD based on the offset code Offset code generated in the offset code generator 250.

The triggering unit 220 may generate a rising clock signal RCLK and a falling clock signal FCLK from the first and second correction clock signals ICLKDD and ICLKBDD, and the pulse detector 230 may generate the duty detection signal DCDOUT according to the pulse width difference between the rising clock signal RCLK and the falling clock signals FCLK. The correction code generator 240 may generate the first correction code I-IB in response to the duty detection signal DCDOUT.

Similarly, the second correction code Q-QB code may be generated based on the third and fourth correction clock signals QCLKDD and QCLKBDD, and the third correction code I-Q code may be generated based on the first and third correction clock signals ICLKDD and QCLKDD.

The phase corrector 280 may correct phases of the first to fourth clock signals ICLK, ICLKB, QCLK, and QCLKB based on the first to third correction codes I-IB code, Q-QB code, and I-Q code, and generate the first to fourth calibration clock signals ICLKD, ICLKBD, QCLKD, and QCLKBD.

Figure 13:
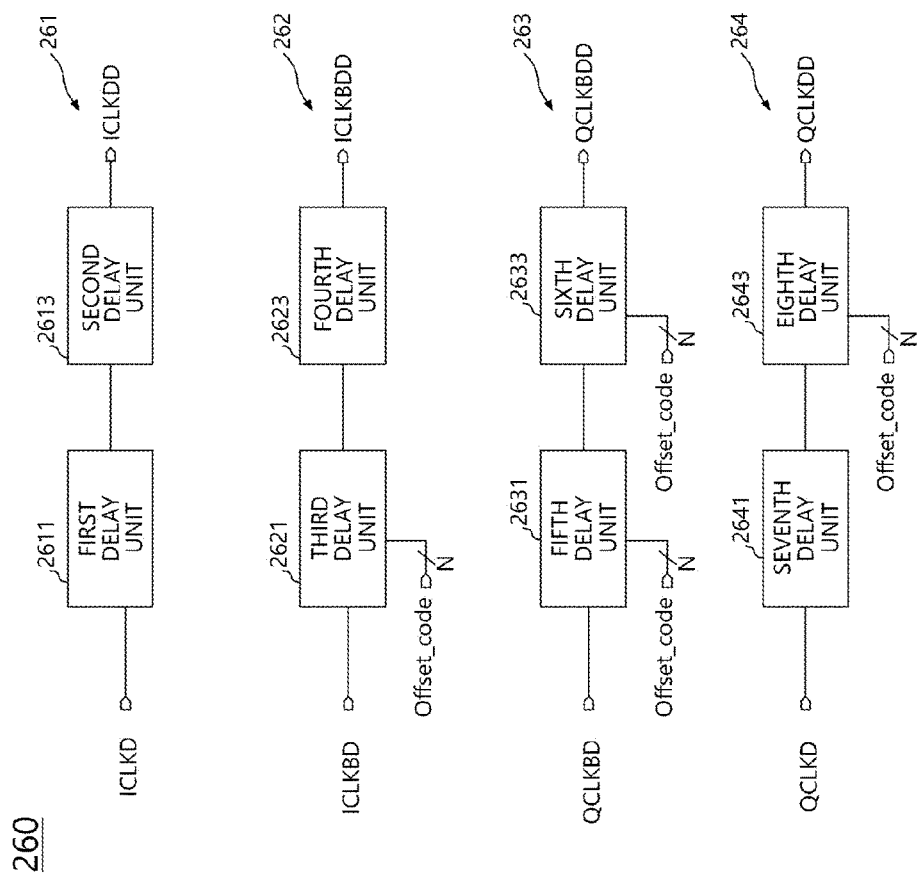
FIG. 13 is a configuration diagram illustrating a representation of an example of a compensator according to an embodiment.

FIG. 13 is a configuration diagram illustrating a representation of an example of a compensator according to an embodiment.

Referring to FIG. 13, the compensator 260 may include a first calibration unit 261, a second calibration unit 262, a third calibration unit 263, and a fourth calibration unit 264.

The first calibration unit 261 may generate the first correction clock signal ICLKDD by delaying the first calibration clock signal ICLKD for a certain time. The first calibration unit 261 may include first and second delay units configured to delay the first calibration clock signal ICLKD by a preset delay time.

The second calibration unit 262 may generate the second correction clock signal ICLKBDD by delaying the second calibration clock signal ICLKBD for a time based on the offset code Offset code. The second calibration unit 262 may include a third delay unit 2621 configured to provide a delay amount based on the offset code Offset code and a fourth delay unit 2623 configured to provide a preset delay amount.

The third calibration unit 263 may generate the fourth correction clock signal QCLKBDD by delaying the fourth calibration clock signal QCLKBD for a time based on the offset code Offset code. The third calibration unit 263 may include a fifth delay unit 2631 configured to perform first delay on the fourth calibration clock signal QCLKBD by the offset code Offset code and a sixth delay unit 2633 configured to perform second delay on an output signal of the fifth delay unit 2631 by the offset code Offset code.

The fourth calibration unit 264 may generate the third correction clock signal QCLKDD by delaying the third calibration clock signal QCLKD by a time based on the offset code Offset code. The fourth calibration unit 264 may include a seventh delay unit 2641 configured to delay the third calibration clock signal QCLKD while the fourth calibration clock signal QCLKBD is first-delayed and an eighth delay unit 2643 configured to generate the third correction clock signal QCLKDD by delaying the third calibration clock signal QCLKD by the offset code Offset code.

The clock generation circuit 20 according to the embodiment may first generate the offset code Offset code by estimating an offset which may exist in the clock generation circuit 20 after the DLL locking. The clock generation circuit 20 may generate the first to fourth correction clock signals ICLKDD, ICLKBDD, QCLKDD, and QCLKBDD by correcting the first to fourth calibration clock signals ICLKD, ICLKBD, QCLKD, and QCLKBD based on the offset code Offset code.

The clock generation circuit 20 may generate the first to third correction codes I-IB code, Q-QB code, and I-Q code based on the first to fourth correction clock signals ICLKDD, ICLKBDD, QCLKDD, and QCLKBDD through the pulse detector 230 and the correction code generator 240. As the first to fourth clock signals ILCK, ICLKB, QCLK, and QCLKB are generated from the differential signal generator 270, the clock generation circuit 20 may generate the first to fourth calibration clock signals ICLKD, ICLKBD, QCLK, and QCLKBD by correcting the first to fourth clock signals ICLK, ICLKB, QCLK, and QCLKB by the first to third correction codes I-IB code, Q-QB code, and I-Q code through the phase corrector 280.

Figure 14:
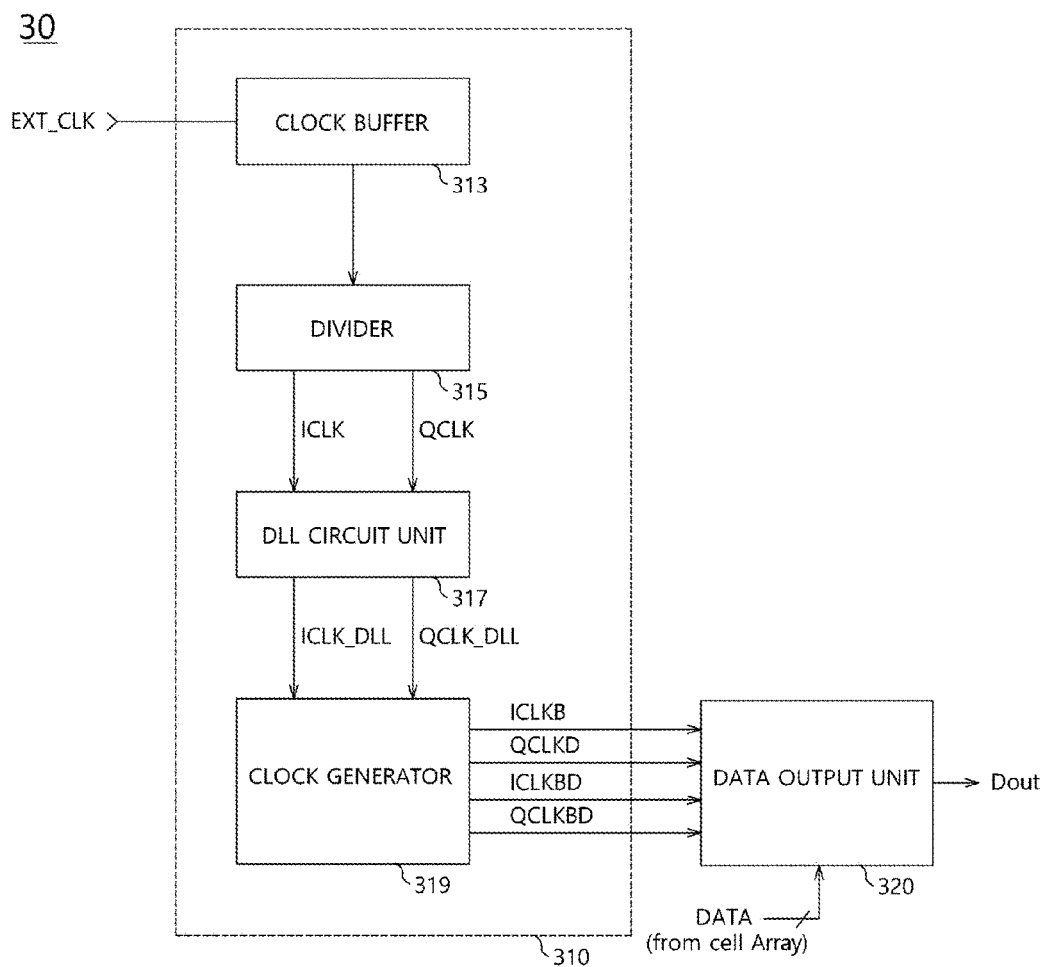
FIG. 14 is a configuration diagram illustrating a representation of an example of a semiconductor apparatus according to an embodiment.

FIG. 14 is a configuration diagram illustrating a representation of an example of a semiconductor apparatus according to an embodiment.

A semiconductor apparatus 30 according to an embodiment may include a clock providing unit 310 and a data output unit 320.

The clock providing unit 310 may receive an external clock signal EXT_CLK and generate multiphase calibration clock signals ICLKB, ICLKBD, QCLKD, and QCLKBD by dividing the external clock signal EXT_CLK.

The clock providing unit 310 may include a clock buffer 313, a divider 315, a DLL circuit unit 317, and a clock generator 319.

The clock buffer 313 may generate a reference clock signal from the external clock signal EXT_CLK.

The divider 315 may generate a pair of divided clock signals ICLK and QCLK by dividing the reference clock signal.

The DLL circuit unit 317 may generate a pair of locked internal clocks ICLK_DLL and QCLK_DLL by controlling phases of the pair of divided clock signals ICLK and QCLK.

The clock generator 319 may generate multiphase clock signals ICLK, ICLKB, QCLK, and QCLKB from the pair of locked internal clocks ICLK_DLL and QCLK_DLL and generate the multiphase calibration clock signals ICLKD, ICLKBD, QCLKD, and QCLKBD by correcting the phases of the multiphase clock signals ICLK, ICLKB, QCLK, and QCLKB.

For example, as the clock generator 319, the clock generation circuit 10 or 20 illustrated in FIG. 1 or 12 may be used.

The data output unit 320 may receive data from a memory cell array, and generate output data Dout in synchronization with the multiphase calibration clock signals ICLK, ICLKB, QCLK, and QCLKB.

In the semiconductor apparatus 30 with high-speed operation, the phase relationship of the multiphase clock signals may be accurately controlled, and thus reliability of the data Dout output from the data output unit 320 may be ensured.

Figure 15:
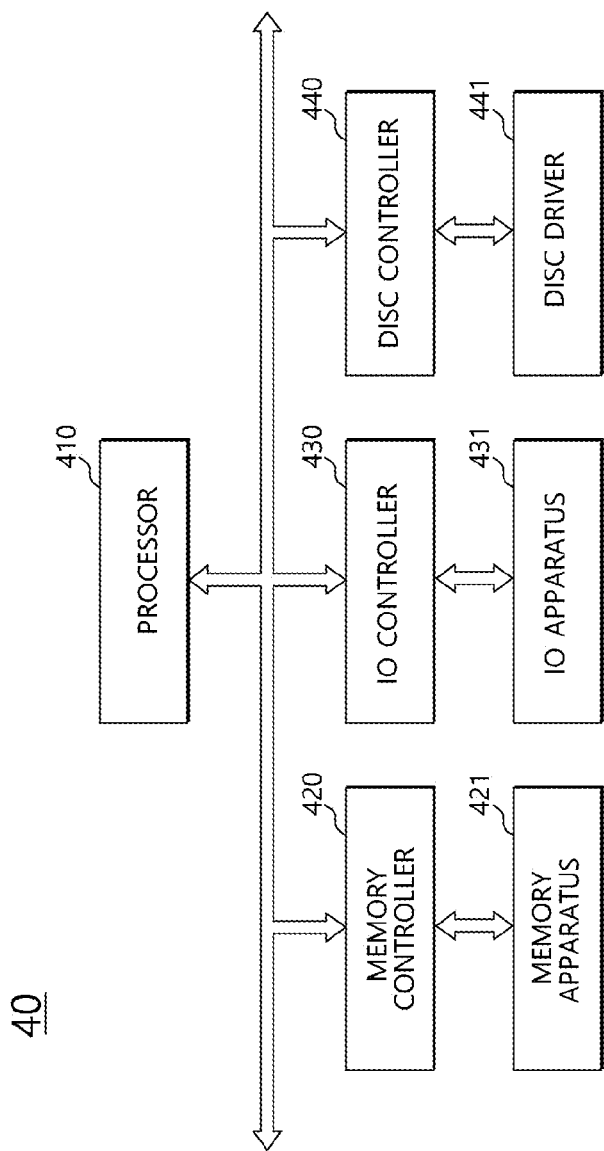
FIG. 15 is a configuration diagram illustrating a representation of an example of an electronic system according to an embodiment.

FIG. 15 is a configuration diagram illustrating a representation of an example of an electronic system according to an embodiment.

An electronic system 40 according to an embodiment may include a processor 410, a memory controller 420, a memory apparatus 421, an IO controller 430, an IO apparatus 431, a disc controller 440, and a disc driver 441.

At least one processor 410 may be provided, and the processor 410 may be operated independently from other processors or may be operated in conjunction with the other processors. The processor 410 may have an environment which communicates with other components, for example, the memory controller 420, the IO controller 430, and the disc controller 440 through a bus (control bus, address bus, and data bus).

The memory controller 420 may be coupled to at least one memory apparatus 421. The memory controller 420 may receive a request provided from the processor 410, and control the at least one memory apparatus 421 based on the request.

The memory apparatus 421 may be, for example, the above-described memory apparatuses.

The I/O controller 430 may be coupled between the processor 410 and the IO apparatus 431 and may transfer an input from the IO apparatus 431 to the processor 410 or provide a processing result of the processor 410 to the IO apparatus 431. The IO apparatus 431 may include an input device such as a keyboard, a mouse, a touch screen, or a microphone, and an output device such as a display or a speaker.

The disc controller 440 may control at least one disc driver 441 according to control of the processor 410.

In the electronic system 40, the memory apparatus 421 may include the clock generation circuit 10 or 20 illustrated in FIG. 1 or 12. In other embodiments, the memory apparatus 421 may be the semiconductor apparatuses 30 illustrated in FIG. 14, and the semiconductor apparatuses 30 may include the clock generation circuit(s) 10 or 20 illustrated in FIG. 1 or 12. Accordingly, the reliable operation may be ensured due to accurate duty ratios of the multiphase internal clock signals generated from the external clock without phase distortion between the multiphase internal clock signals.

The above embodiments are illustrative and not limitative. Various alternatives and equivalents are possible. The description is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A clock generation circuit comprising:
   a reference clock generator configured to generate a pair of first reference clocks in an offset code generation mode;
   a triggering unit configured to generate a pair of second reference clocks from the pair of first reference clocks;
   a pulse detector configured to generate a duty detection signal based on a phase difference between the pair of second reference clocks;
   a correction code generator configured to generate a reference correction code based on the duty detection signal; and
   an offset code generator configured to generate an offset code based on the reference correction code and a preset reference code.

2. The clock generation circuit of claim 1, wherein the correction code generator is configured to generate a correction code according to a duty detection signal between a plurality of clock signals in a phase correction mode after the offset code generation mode, the circuit further comprising:
a compensator configured to generate a compensated correction code by reflecting the offset code to the correction code; and
a phase corrector configured to generate a plurality of calibration clock signals by reflecting the compensated correction code to the plurality of clock signals.

3. The clock generation circuit of claim 1, wherein the reference clock generator includes:
a rising reference clock generation unit configured to receive an inversion signal of a signal applied to an output node of the rising reference clock generation unit and output a first rising reference clock to the output node in response to an internal clock; and
a falling reference clock generation unit configured to receive an inverted signal of the inversion signal and output a first falling reference clock in response to the internal clock.

4. The clock generation circuit of claim 3, wherein the rising reference clock generation unit and the falling reference clock generation unit are configured to have the same delay amount.

5. The clock generation circuit of claim 3, wherein the first rising reference clock and the first falling reference clock have an accurate phase difference of one cycle of the internal clock.

6. The clock generation circuit of claim 2, wherein the correction code generator includes:
a successive approximate register (SAR) configured to convert the duty detection signal to a multi-bit duty detection signal and generate a pulse signal generated in a predetermined period in the phase correction mode as a control signal;
a store signal generation unit configured to generate first to fourth store signals sequentially enabled in response to the control signal;
a first latch configured to store the multi-bit duty detection signal, be driven in response to the first store signal, and output the reference correction code in the offset code generation mode;
a second latch configured to store the multi-bit duty detection signal and be driven in response to the second store signal;
a third latch configured to store the multi-bit duty detection signal and be driven in response to the third store signal;
a fourth latch configured to store the multi-bit duty detection signal and de driven in response to the fourth store signal;
a first output unit configured to generate a first correction code from output signals of the first latch and the second latch in response to the first store signal;
a second output unit configured to generate a second correction code from an output signal from the third latch in response to the second store signal; and
a third output unit configured to generate a third correction code from an output signal of the fourth latch in response to the third store signal.

7. The clock generation circuit of claim 2, wherein the plurality of clock signals are configured to include a first clock signal, a second clock signal having an opposite phase to the first clock signal, a third clock signal corresponding to the first clock signal but is delayed for a predetermined time, and a fourth clock signal having an opposite phase to the third clock signal.

8. The clock generation circuit of claim 2, wherein the plurality of clock signals are configured to include a first clock signal, a second clock signal having an opposite phase to the first clock signal, a third clock signal corresponding to the first clock signal but is delayed for a predetermined time, and a fourth clock signal having an opposite phase to the third clock signal, and
the correction code is configured to include:
a first correction code generated based on a duty detection signal between the first clock signal and the second clock signal;
a second correction code generated based on a duty detection signal between the third clock signal and the fourth clock signal; and
a third correction code generated based on a duty detection signal between the first clock signal and the third clock signal.

9. The clock generation circuit of claim 8, wherein the compensator is configured to generate a compensated first correction code, a compensated second correction code, and a compensated third correction code according to the offset code,
the phase corrector is configured to generate a first calibration clock signal in which the first clock signal is delayed by a preset time, a second calibration clock signal in which the second clock signal is calibrated by the compensated first correction code, a third calibration clock signal in which the third clock signal is calibrated by the compensated third correction code, and a fourth calibration clock signal in which the fourth clock signal is calibrated by the compensated second correction code and the compensated third correction code.

10. The clock generation circuit of claim 1, further comprising a compensator configured to generate a plurality of correction clock signals by reflecting the offset code to a plurality of calibration clock signals generated from a plurality of clock signals in a phase correction mode after the offset code generation mode; and
a phase corrector configured to generate the plurality of calibration clock signals by reflecting a correction code to the plurality of clock signals,
wherein the correction code generator is configured to generate the correction code according to a duty detection signal between the plurality of correction clock signals.

11. The clock generation circuit of claim 10, wherein the correction code generator includes:
a successive approximate register (SAR) configured to convert the duty detection signal to a multi-bit duty detection signal and generate a pulse signal generated in a predetermined period in the phase correction mode as a control signal;
a store signal generation unit configured to generate first to fourth store signals sequentially enabled in response to the control signal;
a first latch configured to store the multi-bit duty detection signal, be driven in response to the first store signal, and output the reference correction code in the offset code generation mode;
a second latch configured to store the multi-bit duty detection signal and be driven in response to the second store signal;
a third latch configured to store the multi-bit duty detection signal and be driven in response to the third store signal;
a fourth latch configured to store the multi-bit duty detection signal and de driven in response to the fourth store signal;

a first output unit configured to generate a first correction code from output signals of the first latch and the second latch in response to the first store signal;

a second output unit configured to generate a second correction code from an output signal from the third latch in response to the second store signal; and a third output unit configured to generate a third correction code from an output signal of the fourth latch in response to the third store signal.

12. The clock generation circuit of claim 11, wherein the plurality of clock signals are configured to include a first clock signal, a second clock signal having an opposite phase to the first clock signal, and a third clock signal corresponding to the first clock signal but is delayed for a predetermined time, and a fourth clock signal having an opposite phase to the third clock signal, and the correction code generator is configured to generate a first correction code generated based on a duty detection signal between the first clock signal and the second clock signal, a second correction code generated based on a duty detection signal between the third clock signal and the fourth clock signal, and a third correction code generated based on a duty detection signal between the first clock signal and the third clock signal.

13. The clock generation circuit of claim 8, wherein the plurality of calibration clock signals include a first calibration clock signal, a second calibration clock signal having an opposite phase to the first calibration clock signal, a third calibration clock signal corresponding to the first calibration clock signal but is delayed for a predetermined time, and a fourth calibration clock signal having an opposite phase to the third calibration clock signal, and the compensator is configured to generate a first correction clock signal by delaying the first calibration clock signal for a preset time, and generate second, third, and fourth correction clock signals by reflecting the offset code to the second, third, and fourth calibration correction signals.

14. The clock generation circuit of claim 1, wherein the clock generation circuit enters the offset code generation mode after locking of a delay locked loop (DLL).

15. A semiconductor apparatus comprising:
a clock providing unit configured to generate a plurality of calibration clock signals from an external clock signal; and
a data output unit configured to process data in response to the plurality of calibration clock signals,
wherein the clock providing unit includes:
a reference clock generator configured to generate a pair of first reference clocks in an offset code generation mode;
a triggering unit configured to generate a pair of second reference clocks from the pair of first reference clocks;
a pulse detector configured to generate a duty detection signal based on a phase difference between the pair of second reference clocks;
a correction code generator configured to generate a reference correction code based on the duty detection signal; and
an offset code generator configured to generate an offset code based on the reference correction code and a preset reference code.

16. The semiconductor apparatus of claim 15, wherein the correction code generator is configured to generate a correction code according to a duty detection signal between a plurality of clock signals in a phase correction mode after the offset code generation mode, the clock providing unit further includes:
a compensator configured to generate a compensated correction code by reflecting the offset code to the correction code; and
a phase corrector configured to generate the plurality of calibration clock signals by reflecting the compensated correction code to the plurality of clock signals.

17. The semiconductor apparatus of claim 15, wherein the clock providing unit further includes:
a compensator configured to generate a plurality of correction clock signals by reflecting the offset code to the plurality of calibration clock signals generated from a plurality of clock signals in a phase correction mode after the offset code generation mode; and
a phase corrector configured to generate the plurality of calibration clock signals by reflecting a correction code to the plurality of clock signals,
wherein the correction code generator is configured to generate the correction code according to a duty detection signal between the plurality of calibration clock signals.

18. The semiconductor apparatus of claim 15, wherein the clock providing unit enters the offset code generation mode according to locking of a delay locked loop (DLL).

19. A method of generating a clock, the method comprising:
generating an offset code based on a first reference clock in an offset code generation mode;
generating a correction code according to a duty detection signal between a plurality of clock signals in a phase correction mode;
generating a compensated correction code by compensating the correction code based on the offset code in the phase correction mode; and
generating a plurality of calibration clock signals from the plurality of clock signals based on the compensated correction code.

20. The method of claim 19, wherein the generating of the offset code includes:
generating a pair of first reference clocks;
generating a pair of second reference clocks from the pair of first reference clocks;
generating a duty detection signal according to a phase difference between the pair of second reference clocks;
generating a reference correction code based on the duty detection signal; and
generating the offset code based on the reference correction code and a preset reference code.

21. The method of claim 19, wherein the offset code generation mode is performed after locking of a delay locked loop (DLL).

22. A method of generating a clock, the method comprising:
generating an offset code based on a first reference clock in an offset code generation mode;
generating a plurality of correction clock signals from a plurality of calibration clock signals based on the offset code in a phase correction mode;
generating a correction code according to a duty detection signal between the plurality of correction clock signals; and
generating the plurality of calibration clock signals from a plurality of clock signals based on the correction code.

23. The method of claim 22, wherein the generating of the offset code includes:

generating a pair of first reference clocks;
generating a pair of second reference clocks from the pair of first reference clocks;
generating a duty detection signal according to a phase difference between the pair of second reference clocks;
generating a reference correction code based on the duty detection signal; and
generating the offset code based on the reference correction code and a preset reference code.

24. The method of claim 22, wherein the offset code generation mode is performed after locking of a delay locked loop (DLL).

25. A method of generating a clock, the method comprising:
generating a pair of first reference clocks in an offset code generation mode;
generating a pair of second reference clocks from the pair of first reference clocks;
generating a duty detection signal according to a phase difference between the pair of second reference clocks;
generating a reference correction code based on the duty detection signal; and
generating the offset code based on the reference correction code and a preset reference code.

26. The method of claim 25, further comprising: in the phase correction mode after the offset code generation mode,
generating a correction code according to a duty detection signal between a plurality of clock signals;
generating a compensated correction code by reflecting the offset code to the correction code; and
generating a plurality of calibration clock signals by reflecting the compensated correction code to the plurality of clock signals.

27. The method of claim 25, further comprising: in the phase correction mode after the offset code generation mode,
generating a plurality of correction clock signals by reflecting the offset code to a plurality of calibration clock signals generated from a plurality of correction signals;
generating a correction code according to a duty detection signal between the plurality of correction clock signals; and
generating the plurality of calibration clock signals by reflecting the correction code to the plurality of clock signals.

28. The method of claim 25, wherein the offset code generation mode is performed after locking of a delay locked loop (DLL).

29. A clock generation circuit comprising:
a phase corrector configured to receive multiphase clock signals and correct the phases of the multiphase clock signals during a phase correction mode; and
an offset code generator configured to generate an offset code based on a preset reference code and a reference correction code, wherein the reference correction code is generated based on a duty ratio or a phase difference between a pair of second reference clocks,
wherein before the phase correction is performed on the multiphase clock signals and before the phase correction mode, the clock generation circuit estimates an offset existing within the clock generation circuit and then generates the offset code based on the estimated offset for correcting the phases of the multiphase clocks based on the generated offset code.

30. The clock generation circuit of claim 29, further comprising:
a triggering unit configured to generate the pair of second reference clocks in synchronization with a pair of first reference clocks.

31. The clock generation circuit of claim 29,
wherein the phase difference between the pair of second reference clocks is created by an offset caused from a delay in the phase corrector, in the triggering unit, or in a path, the path beginning from the phase corrector and ending at an output terminal of the triggering unit.

32. The clock generation circuit of claim 29, further comprising:
a reference clock generator configured to generate the pair of first reference clocks before the phase correction is performed on the multiphase clock signals;
a pulse detector configured to generate a duty detection signal based on the phase difference between the pair of second reference clocks; and
a correction code generator configured to generate the reference correction code based on the duty detection signal.

33. The clock generation circuit of claim 32, wherein the correction code generator generates a correction code according to a duty detection signal between a plurality of multiphase clock signals after the clock generation circuit estimates the offset existing within the clock generation circuit,
the clock generation circuit further comprising:
a compensator configured to generate a compensated correction code by reflecting the offset code to the correction code,
wherein the phase corrector generates a plurality of calibration clock signals by reflecting the compensated correction code to the plurality of multiphase clock signals.

34. The clock generation circuit of claim 32, further comprising:
a compensator configured to generate a plurality of correction clock signals by reflecting the offset code to a plurality of calibration clock signals generated from the multiphase clock signals after the clock generation circuit estimates the offset existing within the clock generation circuit,
wherein the phase corrector generates the plurality of calibration clock signals by reflecting a correction code to the multiphase clock signals, and
wherein the correction code generator is configured to generate the correction code according to a duty detection signal between the plurality of correction clock signals.

35. The clock generation circuit of claim 34,
wherein the phase difference between the pair of second reference clocks is created by an offset caused from a delay in the phase corrector, in the triggering unit, or in a path from the phase corrector continuing through the compensator and ending at an output terminal of the triggering unit.

* * * * *